United States Patent
Moriya et al.

(10) Patent No.: US 7,126,501 B2
(45) Date of Patent: Oct. 24, 2006

(54) FLOATING POINT TYPE DIGITAL SIGNAL REVERSIBLE ENCODING METHOD, DECODING METHOD, DEVICES FOR THEM, AND PROGRAMS FOR THEM

(75) Inventors: Takehiro Moriya, Tokyo (JP); Dai Yang, San Diego, CA (US); Akio Jin, Tokyo (JP); Kazunaga Ikeda, Fujisawa (JP)

(73) Assignee: Nippon Telegraph and Telephone Corporation, Tokyo (JP)

( * ) Notice: Subject to any disclaimer, the term of this patent is extended or adjusted under 35 U.S.C. 154(b) by 0 days.

(21) Appl. No.: 10/550,527

(22) PCT Filed: Apr. 27, 2004

(86) PCT No.: PCT/JP2004/006085

§ 371 (c)(1),
(2), (4) Date: Sep. 22, 2005

(87) PCT Pub. No.: WO2004/098066

PCT Pub. Date: Nov. 11, 2004

(65) Prior Publication Data

US 2006/0181436 A1  Aug. 17, 2006

(30) Foreign Application Priority Data

Apr. 28, 2003  (JP) .............................. 2003-124011

(51) Int. Cl.
*H03M 7/00* (2006.01)
(52) U.S. Cl. .................... 341/50; 341/51; 704/212; 704/500; 704/501; 704/503; 704/504
(58) Field of Classification Search ............... 704/212, 704/500–501, 503–504
See application file for complete search history.

(56) References Cited

U.S. PATENT DOCUMENTS 4,922,537 A * 5/1990 Frederiksen ............... 704/212

(Continued)

FOREIGN PATENT DOCUMENTS

JP  2001-44847  2/2001

(Continued)

OTHER PUBLICATIONS

Moriya et al., "Onkyo shingo no Sampling Rate Scalable Lossless Fugoka", Joho Kagaku Gijutsu Forum Ippan Koen Ronbun Bunshu, vol. 2, pp. 227-228 (2002), no month.

(Continued)

*Primary Examiner*—Rexford Barnie
*Assistant Examiner*—Kai Nguyen
(74) *Attorney, Agent, or Firm*—Oblon, Spivak, McClelland, Maier & Neustadt, P.C.

(57) ABSTRACT

Digital signal samples X in a floating-point format, each of which is composed of 1 bit of sign, 8 bits of exponent E and 23 bits of mantissa M, are converted through rounding by an integer formatting part 12 into digital signal samples Y in an integer format, the sequence of the digital signal samples Y is losslessly compression-coded by a compressing part 13 into a code sequence Ca, and the code sequence Ca is output. The digital signal samples Y are converted by a floating point formatting part 15 into digital signal samples X' in the floating-point format, a difference signal ΔX indicating the difference between the digital signal sample X' and the digital signal sample X is determined by a subtraction part 16, the difference signal ΔX is losslessly coded, and the resulting code sequence Cb is output.

24 Claims, 8 Drawing Sheets

U.S. PATENT DOCUMENTS

| | | | |
|---|---|---|---|
| 5,575,148 A * | 11/1996 | Hirata et al. | 60/445 |
| 5,839,100 A * | 11/1998 | Wegener | 704/220 |
| 6,043,763 A * | 3/2000 | Levine | 341/51 |
| 6,549,147 B1 * | 4/2003 | Moriya et al. | 341/50 |
| 2003/0046064 A1 * | 3/2003 | Moriya et al. | 704/201 |
| 2005/0091051 A1 * | 4/2005 | Moriya et al. | 704/229 |
| 2006/0087464 A1 * | 4/2006 | Moriya et al. | 341/144 |

FOREIGN PATENT DOCUMENTS

| | | |
|---|---|---|
| JP | 2003-332914 | 11/2003 |
| WO | 2003/077425 | 9/2003 |

OTHER PUBLICATIONS

Hans et al., "Lossless Compression of Digital Audio", IEEE Signal Processing Magazine, pp. 21-32 (Jul. 2001).

Yang et al., "Lossless Compression for Audio Data in the IEEE Floating-Point Format", AES 115$^{th}$ Convention, New York, (Oct. 2003) 5 pages.

WD 3 of ISO/IEC 14496-3:2001/AMD 4, Audio Lossless Coding, Munich, Germany (Mar. 2004) 43 pages.

Kuzuki et al., "DVD-Audio Specifications", IEEE Signal Processing Magazine (Jul. 2003).

* cited by examiner

US 7,126,501 B2

FLOATING POINT TYPE DIGITAL SIGNAL REVERSIBLE ENCODING METHOD, DECODING METHOD, DEVICES FOR THEM, AND PROGRAMS FOR THEM

RELATED APPLICATION

This application is a 371 of PCT/JP04/06085, filed Apr. 27th, 2004, which claims priority of Japan application 200-124011, filed Apr. 28th, 2003,

TECHNICAL FIELD

The present invention relates to a coding method for compressing a digital sound, music or image signal into codes of smaller information quantity, a corresponding decoding method, a coding apparatus therefor, a decoding apparatus therefor, and programs therefor.

BACKGROUND ART

As a method for compressing sound or image information, there is known a lossless coding method that involves no distortion.

Highly compressive lossless data compression can be achieved by combining a highly compressive lossy coding and a lossless compression of the difference between the reproduced signal and the original signal that appear in the lossy coding. Such a combined compression method has been proposed in Japanese Patent Application Kokai Publication No. 2001-44847. This method, which is described in detail in the patent literature, will be described briefly below.

In a coder, a frame forming part successively separates digital input signals (referred to also as an input signal sample sequence) into frames, each of which is composed of 1024 input signal samples, for example, and the digital signals are lossily compression-coded on the frame basis. This coding can be based on any format that is suitable for the input digital signal and can reproduce the original digital input signal with a certain fidelity by decoding. For example, if the digital input signal is a sound signal, a speech coding recommended according to ITU-T recommendation G.729 can be used. If the digital input signal is a music signal, a transform-domain weighted interleaved vector quantization (Twin VQ) coding used in MPEG-4 can be used. The codes resulting from the lossy compression coding are locally decoded, and a difference signal that represents the difference between the locally decoded signal and the original digital signal is produced. Actually, however, there is no need of local decoding, and the difference between the original digital signal and a quantized signal resulting during the lossy compression coding can be determined. The amplitude of the difference signal is typically much smaller than that of the original digital signal. Thus, the quantity of information can be reduced by the lossless compression coding of the difference signal, compared with the lossless compression coding of the original digital signal.

To enhance the efficiency of the lossless compression coding, from each of the samples in the sample sequence frame of the difference signal in the sign and magnitude notation (a binary number of sign and magnitude), the MSB, the second MSB, . . . , and the LSB are extracted, and the MSBs, the second MSBs, . . . , and the LSBs are each linked along the sample sequence (that is, the time series), thereby forming the respective bit sequences. In other words, the bit arrangement is changed. For convenience, the bit sequence composed of linked 1024 bits at the equal bit position is referred to as a "coordinate bit sequence". On the other hand, a one-word bit sequence representing the amplitude value including the sign of each sample is referred to as an "amplitude bit sequence", for convenience. The difference signal has a small amplitude, and therefore, the most significant bit is, or the most significant bit and the following plural bits are, often all "0". The coordinate bit sequence formed by linking the bits at such a bit position is a bit sequence of "0". Therefore, the coordinate bit sequence can be represented by a predetermined short code, and thus, the efficiency of the lossless compression coding of the difference signal can be enhanced.

The coordinate bit sequence is losslessly compression-coded. As the lossless compression coding, an entropy coding, such as Huffman coding and arithmetic coding, can be used which takes advantage of the occurrence or frequent occurrence of a sequence in which the same sign (1 or 0) successively appears.

When decoding, the codes resulting from the lossless compression coding are decoded, and the inverse transformation of bit arrangement is performed on the decoded signal. That is, the coordinate bit sequences are converted into the amplitude bit sequences for each frame, and the resulting difference signals are reproduced sequentially. In addition, the codes resulting from the lossy compression coding are decoded, the decoded signal and the reproduced difference signal are summed together, and then, the sum signals for each frame are linked together sequentially, thereby reproducing the original digital signal sequence.

Besides, there are known a variety of lossless coding methods for audio or visual information that permit no distortion. For example, a lossless coding method for music information is disclosed in "Lossless Compression of Digital Audio" by Mat Hans, Ronald W. Schafer et al., IEEE SIGNAL PROCESSING MAGAZINE, July 2001, pp. 21–32. Any conventional methods are compression coding methods that use a signal waveform directly as a PCM signal.

However, in music recording studios, a waveform is sometimes recorded and retained in the floating-point format. Any value in the floating-point format is separated into a sign, an exponent and a mantissa. For example, in the IEEE 754 standard floating-point format shown in FIG. 1, any value consists of 32 bits including 1 bit for sign, 8 bits for exponent and 23 bits for mantissa in the descending order of significance. Denoting the sign by S, the value represented by the 8 bits for exponent by a decimal number E and the binary number for mantissa by M, the value in the floating-point format can be represented in the sign and magnitude binary notation as:

$$(-1)^S \times 1.M \times 2^{E-E_0} \qquad (1)$$

According to the IEEE 754 standard, $E_0$ is defined as $E_0 = 2^7 - 1 = 127$, so that the "$E-E_0$" in the expression (1) can assume any value falling within the range:

$$-127 \leq E - E_0 \leq 128.$$

In the case where sound, music or image information is represented by a digital signal sequence in the floating-point format, the bit sequence composed of "0"s and "1"s is likely to be random because of the characteristics of the floating-point format. Thus, even if the bit arrangement transformation described above is performed, the entropy compression coding or the like cannot be expected to provide a high compression ratio. Furthermore, the sample sequence in the floating-point format significantly differs from the original analog waveform, so that there is no redundancy due to correlation between samples. Therefore, even if the lossless predictive coding method disclosed in the above-described literature by Mat Hans, Ronald W. Schafer et al. is applied, a higher compression ratio cannot be expected.

Patent literature 1: Japanese Patent Application Kokai Publication No. 2001-44847

DISCLOSURE OF THE INVENTION

Problem to be Solved by the Invention

An object of the present invention is to provide a lossless coding method for a digital signal in the floating-point format that permits no distortion and has a high compression ratio, a corresponding decoding method, apparatus therefor and programs therefor.

Means to Solve the Problem

A lossless coding method and a lossless coding apparatus for a digital signal in a floating-point format according to the present invention involve converting a first digital signal sample in the floating-point format into a second digital signal sample in an integer format, losslessly compressing the second digital signal sample in the integer format to produce a code sequence, producing a difference signal that corresponds to the difference between the second digital signal sample in the integer format and the first digital signal sequence in the floating-point format, and outputting the code sequence and difference information corresponding to the difference signal as a coding result.

In this way, by converting digital signal samples in the floating-point format into digital signal samples in the integer format, which approximate to the waveform of the original analog signals, highly efficient compression can be achieved by a compression method that eliminates a redundancy due to correlation between signal samples.

A decoding method and a decoder for a digital signal in a floating-point format according to the present invention involve decoding and expanding a code sequence to produce a first digital signal sample in an integer format, producing a difference signal based on difference information, converting the first digital signal sample in the integer format into a second digital signal sample in the floating-point format, and combining the first digital signal sample in the floating-point format and the difference signal to produce a third digital signal sample in the floating-point format.

Effects of the Invention

According to the present invention, a digital signal sample sequence in the floating-point format can be efficiently losslessly compressed. In addition, a typical compression-coding module designed for a sample sequence in the integer format can be used to handle both the integer format and the floating-point format, without increasing significantly the scales of the processing apparatus and the program.

BEST MODES FOR CARRYING OUT THE INVENTION

First Embodiment

Figure 1:
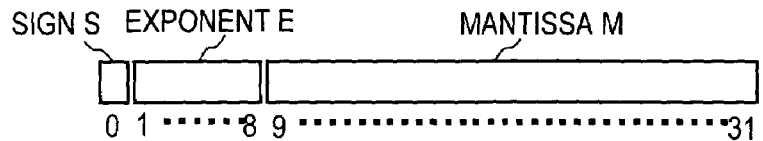
FIG. 1 shows a format of 32-bit floating point representation according to the IEEE-754.
Figure 2:
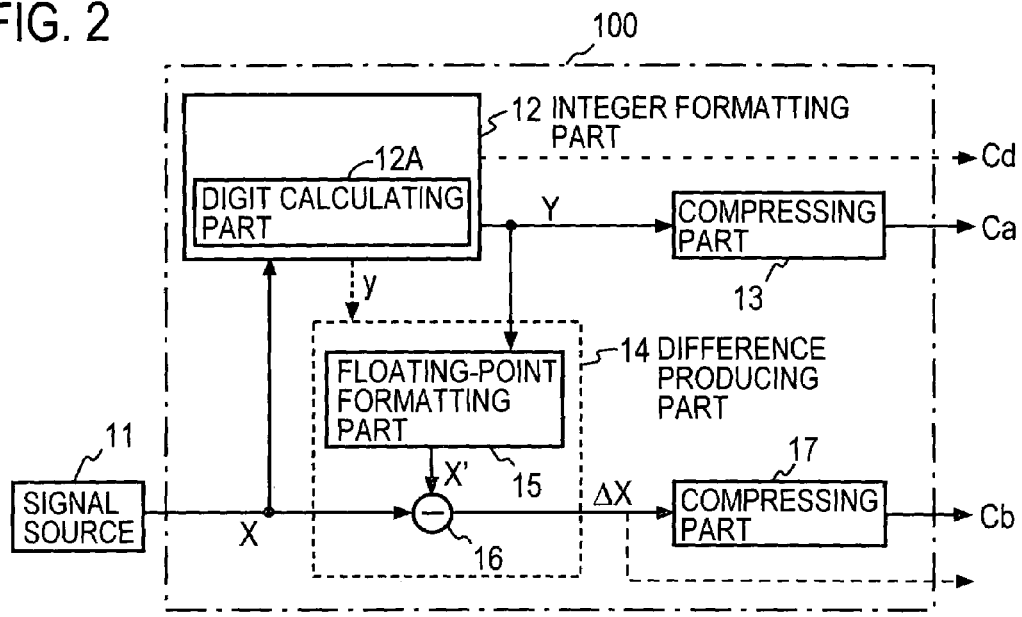
FIG. 2 is a functional diagram of a coder according to a first embodiment of the present invention.

FIG. 2 shows a functional configuration of a coder according to an embodiment of the present invention. A coder 100 according to this embodiment comprises an integer formatting part 12, a compressing part 13, a difference producing part 14, and a compressing part 17. The integer formatting part 12 has a digit calculating part 12A, and the difference producing part 14 comprises a floating-point formatting part 15 and a subtraction part 16. As a sequence of digital signal samples X in the 32-bit floating-point format, a signal source 11 outputs a music signal sample sequence. Each of the digital signal samples X is produced by performing a processing, such as transformation, amplitude adjustment, effect addition and mixing, on a raw signal recorded in the 24-bit integer format and converting the resulting signal having a fractional part as a result of the processing into the floating-point format, or produced by converting a raw signal recorded in the 24-bit integer format into the 32-bit floating-point format and performing such processing as described above on the resulting signal. Here, the integer value may be directly converted into a floating-point value, or normalization may be performed so that an integer 32768 is normalized to 1.0. The following description will be made assuming the former case. However, the two cases differ only in the value of the exponential part, and the present invention can be applied to both the cases.

Figure 3:
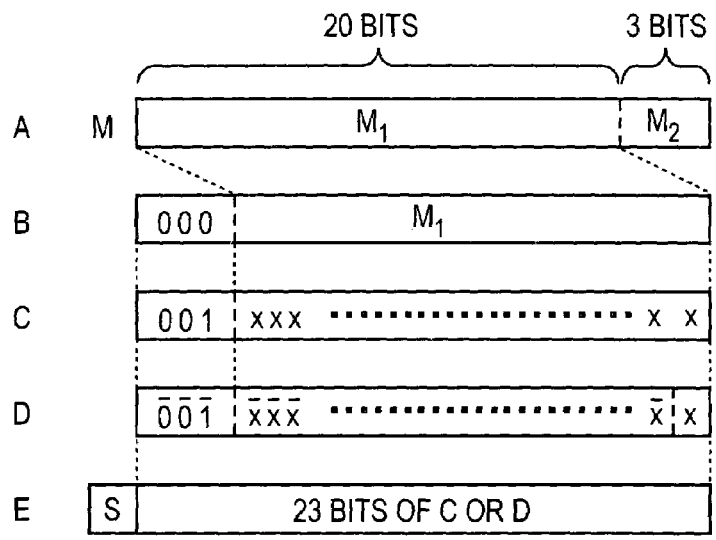
FIG. 3 is a diagram for illustrating an operation of an integer formatting part 12 shown in FIG. 2.

Digital signal samples X in the floating-point format are input to the integer formatting part 12, and each sample is converted into a digital signal sample Y in the integer format. As described above, in the example described above, the digital signal sample X is often derived from a raw signal in the 24-bit integer format through a processing, such as transformation, amplitude adjustment and effect addition, so that the amplitude of the signal typically does not vary significantly. Thus, the integer formatting part 12 can simply convert the floating-point number into an integer by rounding of fractional part. In the following, a case where truncation is performed as rounding will be described with reference to FIG. 3. While the number of digits of the integer format may be 16 bits, 20 bits or the like, it will be assumed in the following description that the number of digits of the integer format is 24 bits.

If the exponent value E is 147, for example, the bit adjacent the decimal point on its higher order side is the 20th bit (=147−127) from the MSB in the mantissa M. As shown in FIG. 3A, in the sign and magnitude binary notation, the 20 most significant bits ($M_1$) in the 23-bit mantissa M constitute the integer part, and the remaining three least significant bits ($M_2$) constitute the fractional part below the decimal point. Therefore, as shown in 3B, if the mantissa M is shifted by three bits toward the least significant bit position so that the least significant bit in the integer part ($M_1$) is positioned at the least significant bit in the entire 23-bit mantissa, overflow of the three bits ($M_2$) below the decimal point occurs, and thus, the three bits are truncated. Then, the least significant bit in the three most significant bits having been made unoccupied ("000" in this example) by such shifting (that is, the 21st bit from the least significant bit) is set at 1, which corresponds to "1" of "1.M" in the expression (1), thereby providing a truncated integer value (see FIG. 3C). Alternatively, "1" may be added before the most significant bit in the 23 bits before shifting, and the resulting 24 bits may be shifted by three bits.

Furthermore, the resulting integer value is converted into a two's complement notation. That is, the sign bit S of each digital sample X in the floating-point format is uses as it is as the most significant bit. As for the other 23 bits, if the sign S is "0" (positive), the 23 bits shown in FIG. 3C are used as they are, and if the sign S is "1" (negative), the 23 bits are logically inverted as shown in FIG. 3D, that is, the values "0" and "1" are interchanged, and then, "1" is added to the least significant bit. Here, as the most significant bit, the sign bit S is used as it is. In this way, a 24-bit integer represented in the complement notation is obtained as shown in FIG. 3E.

The above description has been made generally on the assumption that the mantissa M contains 0 or more bits corresponding to the fractional part, and a 32-bit digital signal sample in the floating-point format is converted into a 24-bit digital signal sample in the integer format. However, for example, in the case where a plurality of raw signals in the 24-bit integer format are mixed for processing, one sample may have an amplitude value that is significantly greater than the maximum value that can be represented by 24 bits. In such a case, as an exceptional processing, in the example described above, the value of the exponent E is limited to 150 (=127+23), and the 23 bits of the mantissa M are converted directly into the two's complement notation and used as a digital signal in the 24-bit integer format.

Figure 4:
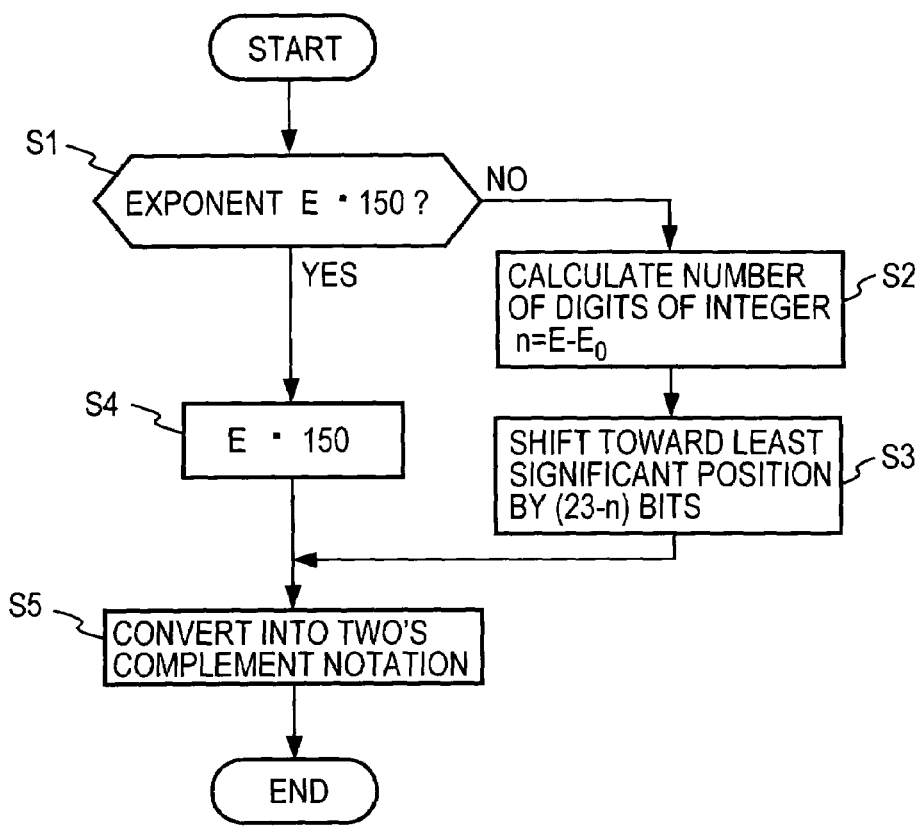
FIG. 4 is a flowchart showing a procedure in the integer formatting part 12 shown in FIG. 2.

The integer formatting part 12 performs a processing shown in FIG. 4, for example. First, it is determined whether the exponent E is equal to or greater than 150 or not, that is, whether the integer part is constituted by 23 or more bits or not (S1). If the integer part is constituted by less than 23 bits, the digit calculating part 12A determines the number of digits of the integer value (n=E−$E_0$) and outputs the result (S2). Then, the mantissa M is shifted by (23−n) bits toward the least significant position to make overflow of the fractional part occur, and "1" is placed at the (n+1)th bit position viewed from the least significant bit of the resulting integer part composed of n bits (S3). Then, "0"s are supplemented at the remaining bit positions preceding the (n+1)th bit so that the whole mantissa is composed of 23 bits, and based on the sign bit 5, the resulting 23 bits are converted into a 24-bit integer in the two's complement notation, thereby providing one digital value sample in the integer format (S5). Specifically, the sign bit S is used as the most significant bit as it is. As the remaining 23 bits, if the sign S is "0" (positive), the 23 bits beginning with the least significant bit of the integer part resulting from the shifting in step S3 are used, and if the sign S is "1" (negative), the 23 bits beginning with the least significant bit of the integer part resulting from the shifting are inverted except for the most significant bit and used. If the exponent E is equal to or greater than 150 in step 51, the exponent E is limited to 150 in step S4, and then, the process continues to step S5. In the above description, the mantissa M is shifted by (23-n) bits to provide a 24-bit integer value sample in the sign and magnitude binary notation. Alternatively, most significant n (=E−$E_0$) bits may be extracted from the mantissa M, "1" be added at the top of the n bits to make the number of bits (n+1), (22-n) "0"s be added at the top of the (n+1) bits to make the number of bits 23, and then the sign bit S be added at the top of the 23 bits to make the number of bits 24.

In the above description, the integer formatting part 12 performs rounding of the fractional part below the decimal point by truncation in step S3 in FIG. 4. However, round-up may be performed, or truncation or round-up may be selectively performed depending on whether the first decimal place is "1" or "0". If a carry occurs due to the rounding, "1" is added to the least significant bit of the integer part after (23-n)-bit shifting. Furthermore, if a carry occurs at the most significant bit of the integer part as a result of the addition, as shown by a dashed line in FIG. 2, 1-bit information indicating the occurrence of the carry is coded, and the coded information is transmitted as auxiliary information Cd.

A sequence of the digital signal sample Y in the integer format produced by the integer formatting part 12 is, as an integer value, compression-coded in the compressing part 13 by an efficient lossless compression method using correlation with a waveform or the like, and then output as a code sequence Ca. For example, as disclosed in the above-described literature by Mat Hans et al., the lossless compression in the compressing part 13 may be achieved by determining the difference between the value of each sample and a predicted value (integer value), changing the bit arrangement of a sequence of such differences as described in the section "BACKGROUND ART", and then performing the entropy coding on the resulting sequence, that is, the coordinate bit sequence. That is, the sequence of the digital signal samples Y in the integer format approximates to the original analog signal waveform from which the sequence of the digital signal samples X output from the signal source 11 has been derived. Therefore, the sequence of the digital signal samples X can be efficiently losslessly compression-coded by eliminating, by prediction or transformation, the redundancy due to the correlation between the signal samples.

In addition, a difference signal (error) ΔX, which indicates the difference between the digital signal sample Y in the integer format and the corresponding digital signal sample X in the floating-point format output from the signal source 11, is produced in the difference producing part 14. In this example, the digital signal sample Y in the integer format is converted again into a digital signal sample X' in the floating-point format in the floating-point formatting part 15, and the resulting digital signal sample X' in the floating-point format is subtracted from the original digital signal sample X in the floating-point format in the subtraction part 16, thereby producing the difference digital signal ΔX in the floating-point format.

In the case where the digital signal sample in the integer format is composed of 24 bits, the floating-point formatting part 15 can convert the digital signal into a digital signal in the floating-point format composed of 32 bits without any ambiguity or exception. As described above, the exponent E of the original digital signal sample X in the floating-point format is likely to be equal to or less than 149, and in such a case, the difference digital signal ΔX indicating the difference between the digital signal sample X' and the original digital signal sample X in the floating-point format equals to the value of the fractional part of the original digital signal sample X.

The difference signal ΔX from the difference producing part 14 is losslessly compression-coded in the compressing part 17 and, then, output therefrom as difference information Cb. As described above, the difference signal ΔX equals to the value of the fractional part of the original digital signal sample, and if the number of digits below the decimal point of the mantissa of the difference signal is small, the difference signal can be efficiently losslessly compression-coded by the entropy coding or the like. In order to raise the compression efficiency, the compressing part 17 may separate the differences for the exponent E and the mantissa M, perform an appropriate lossless compression coding on each of the differences and output the results separately as code sequences Cb1 and Cb2, respectively. In this case, the exponent E is the same as the exponent of the sample X' and can be found by converting the signal sample Y resulting from decoding of the code Ca on the receiving side into the signal sample X' in the floating-point format, so that the exponent E need not be transmitted. In other words, only the difference for the mantissa M has to be coded and output as the difference information Cb2.

The number of digits below the decimal point of the difference signal ΔX is sometimes large. In such a case, the efficiency of coding may be reduced. Thus, the difference signal ΔX may be output as it is, without being coded, as the difference information. Alternatively, comparison between the difference signal ΔX and the coded difference signal may be made in terms of information quantity, and the one with the smaller quantity of information may be chosen.

As described above, in the exceptional case where the exponent E of the digital signal sample X in the floating-point format is equal to or greater than 150 (E≧150), the integer formatting part 12 transmits an exception signal y, which indicates that the exponent E is limited to 150, to the difference producing part 14, and the difference producing part 14 produces, as a difference signal ΔX, the exponent difference (E−150), which is the difference between the value 150 of the exponent and the value of the exponent E of the digital signal sample X, and the difference for the mantissa M (in which all the bits are set at "0"). The compressing part 17 performs a lossless compression coding on the difference signal ΔX and outputs the resulting code as the difference information Cb. In this case, since all the bits of the difference for the mantissa are "0", the difference for the mantissa may not be transmitted, and only the exponent difference may be coded, and the resulting code be output as the difference information Cb.

Figure 5:
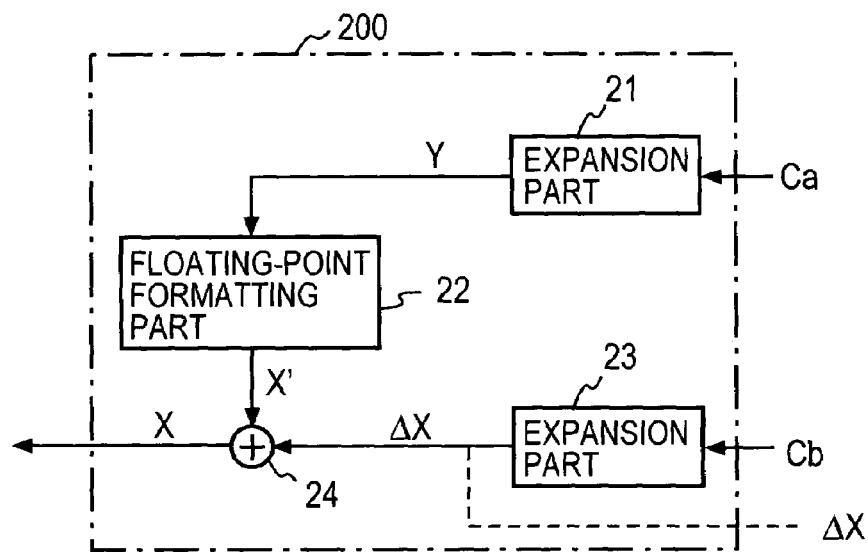
FIG. 5 is a functional diagram of a decoder according to the first embodiment of the present invention.

FIG. 5 shows a decoder 200 according to this embodiment of the present invention, which is associated with the coder 100 shown in FIG. 2.

The input code sequence Ca is losslessly expansion-decoded in an expansion part 21. This lossless expansion decoding corresponds to the lossless compression coding performed in the compressing part 13 shown in FIG. 2 and is to perform a reverse processing of the lossless compression coding. Therefore, this lossless expansion decoding produces a sequence of digital signal samples Y in the 24-bit integer format.

The digital signal sample Y in the integer format is converted into a digital signal sample X' in the 32-bit floating-point format by the floating-point formatting part 22. On the other hand, the input difference information Cb is losslessly expansion-decoded in an expansion part 23. This lossless expansion decoding corresponds to the lossless compression performed in the compressing part 17 shown in FIG. 2. Therefore, this lossless expansion decoding produces a difference signal ΔX.

Since the difference signal equals to the value of the fractional part at the least significant bit position(s), it is inserted to the corresponding least significant bit position(s) of the mantissa of the digital signal sample X' in the floating-point format in a combining part 24, and thus, the digital signal sample X in the floating-point format is reproduced. In the case where the coder 100 shown in FIG. 2 outputs the difference signal ΔX without performing compression coding, the difference signal ΔX received by the decoder 200 is transmitted to the combining part 24 as it is, and the same combination process is performed.

Second Embodiment

Figure 6:
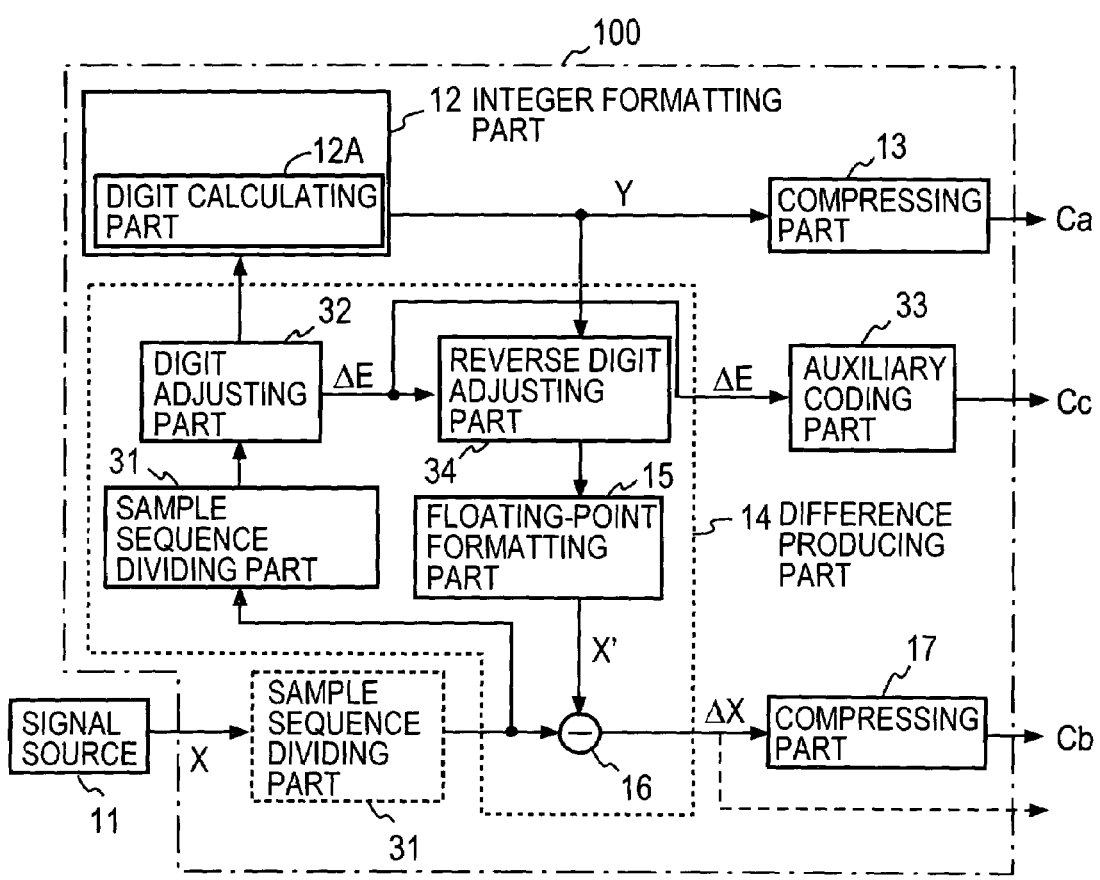
FIG. 6 is a functional diagram of a coder according to a second embodiment of the present invention.

FIG. 6 is a functional diagram of a coder 100 according to a second embodiment of the present invention, in which the parts corresponding to those in FIG. 2 are denoted by the same reference numerals as in FIG. 2. According to the second embodiment, a sample sequence dividing part 31 divides a sequence of digital signal samples X in the floating-point format into blocks of predetermined number of samples or frames, and a digit adjusting part 32 performs digit adjustment on the exponent E on a divisional unit basis so that the number of digits of a digital signal sample Y in the integer format falls within an appropriate range, that is, the number of digits of a digital signal sample in the integer format converted from the digital signal sample X equal to or less than 24, as described below:

(a) If a digital signal sample X in the floating-point format that is so large in amplitude as to have an exponent E greater than 150 is converted into a 24-bit digital signal sample Y in the integer format, the information represented by one or more least significant bits of the mantissa M of the digital signal sample X would be lost. Besides, if a digital signal sample X in the floating-point format that is so large on amplitude as to have an exponent E approximating to but less than 150 is converted into a digital signal sample Y in the integer format, the digital value of the sample would often exceed the 24-bit integer value. In order to avoid these, for each divisional unit, the digit adjusting part 32 subtracts adjustment information ΔE from the exponent E of the digital signal sample X to make the value of the exponent E equal to or less than 150.

(b) If a digital signal sample X in the floating-point format that has a small amplitude is converted into a 24-bit digital signal sample Y in the integer format, and most significant 21 to 23 bits, except for the sign bit S, which is the most significant bit, of the 24 bits of the digital signal sample Y in the integer format are all "0", the amplitude can be represented by only about 2 bits. Thus, the waveform of the sequence of the digital signal samples Y in the integer format does not approximate to the analog waveform, and therefore, the advantage of the conversion into the digital signal sample Y in the integer format, that is, the advantage of the lossless compression coding with a high compression ratio is not provided. In addition, in the case where the amplitude value of the digital signal sample Y in the integer format is represented by about two least significant bits thereof, if the signal sample Y is converted in to a digital signal in the floating-point format, almost all the bits of the mantissa M of the resulting digital signal are "0". For example, all of them are "0", or all of them except for the most significant bit, which is "1", are "0". On the other hand, the mantissa M of the input digital signal sample X in the floating-point format can assume a great value even if the amplitude of the signal sample X is small. Therefore, the mantissa M of the difference signal $\Delta X$ in the floating-point format, which corresponds to the error (difference) from that of the digital signal sample X in the floating-point format, has a large amplitude. That is, the number of bits that are "0" for all the samples is reduced, so that the compression efficiency cannot be raised.

In order to avoid such a problem, the digit adjusting part 32 adds adjustment information $\Delta E$ to each exponent E on a divisional unit basis, so that as much information represented by the mantissa M as possible is contained in the digital signal sample Y in the integer format. In this case, the number of bits of one sample resulting from the conversion into the integer format should not be greater than 24.

The adjustment information $\Delta E$ (an integer of any sign) in the digit adjusting part 32 can be changed for each divisional unit. The digit adjusting part 32 finds the maximum one of the exponents E in each divisional unit and determines the adjustment information $\Delta E$ for the divisional unit so that as much information represented by the mantissa M as possible can be utilized while keeping the number of bits of one sample in the integer format equal to or less than 24.

Figure 7:
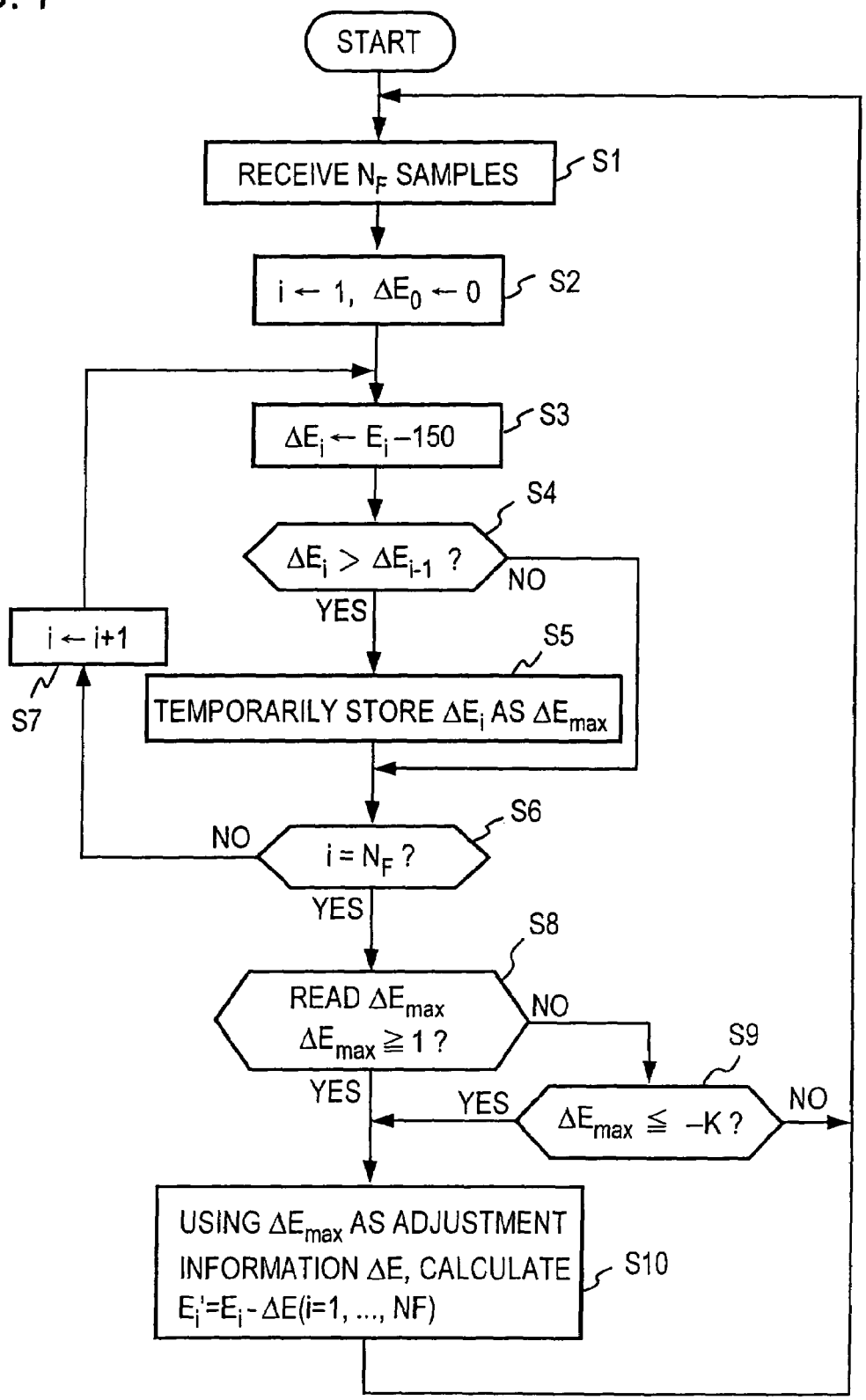
FIG. 7 is a flowchart showing a digit adjustment procedure.

FIG. 7 shows a procedure of the digit adjustment performed by the digit adjusting part 32. This drawing shows a case where the sample sequence dividing part 31 divides a sample sequence by $N_F$ samples, and the digit adjustment is performed for $N_F$ samples as a unit.

In step S1, $N_F$ input samples are received, and in step S2, $i=1$ and $\Delta E_0=0$ are initially set.

In step S3, 150 is subtracted from the exponent $E_i$ of the i-th sample to produce the difference $\Delta E_i$.

In step S4, it is determined whether or not the difference $\Delta E_i$ is greater than the proceding difference $\Delta E_{i-1}$. If the difference $\Delta E_i$ is not greater than the difference $\Delta E_{i-1}$, the process continues to step S6.

If the difference $\Delta E_i$ is greater than the difference $\Delta E_{i-1}$ in step S5, the difference $\Delta E_i$ is regarded as the maximum difference $\Delta E_{max}$ and temporarily saved.

In step S6, it is checked whether or not $i=N_F$. If i is not equal to $N_F$, the number of i is incremented by 1 in step S7, and then, the process returns to step S3.

If it is determined that $i=N_F$ in step S6, in step S8, the maximum difference $\Delta E_{max}$ is read out, and it is checked whether or not the difference $\Delta E_{max}$ is equal to or greater than 1. If the difference $\Delta E_{max}$ is equal to or greater than 1, the process continues to step S10.

If the difference $\Delta E_{max}$ is less than 1 in step S8, in step S9, it is checked whether or not the difference $\Delta E_{max}$ is equal to or less than $-K$, where K is a predetermined integer equal to or greater than 1. If the difference $\Delta E_{max}$ is equal to or less than $-K$, the process continues to step S10.

In step S10, using the maximum difference $\Delta E_{max}$ as adjustment information $\Delta E$, the digit of each of the $N_F$ samples is adjusted according to a relation of $E_i'=E_i-\Delta E$, the resulting $N_F$ samples adjusted in digit are transmitted to the integer formatting part 12, and then the process returns to step S1. If the difference $\Delta E_{max}$ is greater than $-K$ in step S9, the process returns to step S1.

Thus, if the difference $\Delta E_{max}$ is equal to or greater than 1 in step S8, it means that the amplitude of the digital signal sample X is large, and the exponent E is greater than 150. If the difference $\Delta E_{max}$ is equal to or less than $-K$ in step S9, it means the amplitude of the digital signal sample X is small, and the degree of waveform approximation is poor. For example, K can be set at a value from 20 to 22.

As in the first embodiment, the digital signal sample in the floating-point format having been adjusted in digit in this way is converted into a digital signal sample Y in the integer format in the integer formatting part 12, and the sequence of such signal samples Y is losslessly compression-coded in the compressing part 13 to produce a code sequence Ca.

In order that decoding can reproduce losslessly the original digital signal sample X in the floating-point format before coding, an auxiliary coding part 33 codes the adjustment information $\Delta E$ including the sign, which indicates addition or subtraction, to produce an auxiliary code sequence Cc.

In the embodiment shown in FIG. 6, a reverse digit adjusting part 34 in the difference producing part 14 performs a reverse digit adjustment, by the adjustment information $\Delta E$ for the corresponding divisional unit, on the digital signal sequence Y in the integer format. That is, if the digit adjusting part 32 adds negative adjustment information $\Delta E$ (if $\Delta E$ is negative in step S10), the reverse digit adjusting part 34 shifts the 23 bits, excluding the most significant bit, of the corresponding digital signal sample toward the least significant position by $\Delta E$ bits, and fills the bit positions made unoccupied by the shifting with "0"s. If the digit adjusting part 32 adds positive adjustment information $\Delta E$ (if $\Delta E$ is positive in step S10), the reverse digit adjusting part 34 shifts the 23 bits, excluding the most significant bit, of the corresponding digital signal sample toward the most significant position by $\Delta E$ bits, in other words, makes overflow of $\Delta E$ bits occur, and fills the least significant bit positions made unoccupied by the shifting with "1"s to make the number of bits $23+\Delta E$.

The digital signal sample Y in the integer format having been reverse-adjusted in digit is converted into a digital signal sample X' by the floating-point format in the floating-point formatting part 15. The difference $\Delta X$ between the digital signal sample X' in the floating-point format and the original digital signal sample X in the floating-point format is determined by the subtraction part 16. The difference signal $\Delta X$ is losslessly compression-coded by the compressing part 17, and the resulting code sequence Cb is output. In this embodiment again, only the fractional part of the difference signal $\Delta X$ may be output as it is as the difference information, rather than compression-coding the difference signal $\Delta X$. As shown by a dashed line in FIG. 6, the sample sequence dividing part 31 may be provided so as to supply the divisional sequences of digital signal samples X in the floating-point format to both the digit adjusting part 32 and the subtraction part 16.

Figure 8:
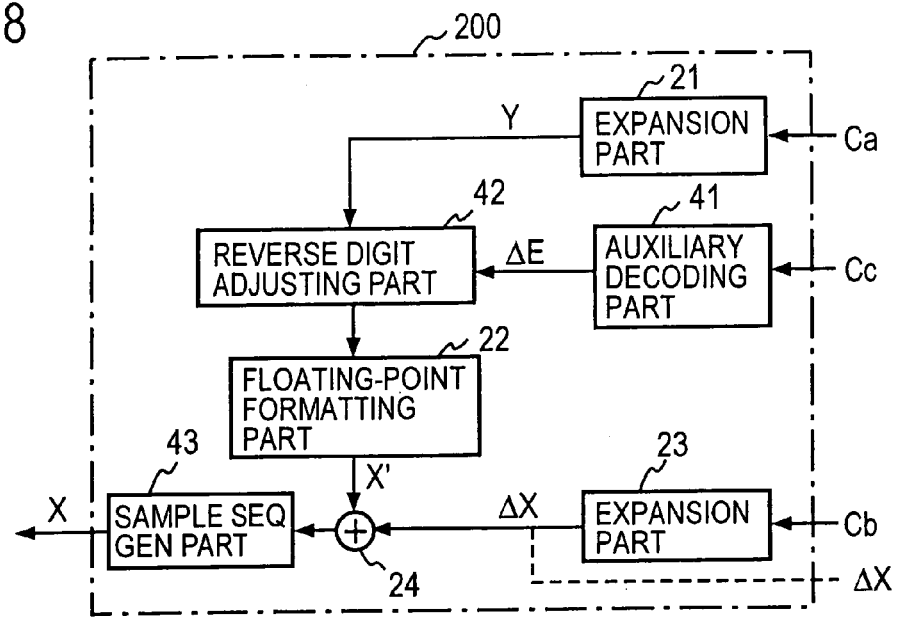
FIG. 8 is a functional diagram of a decoder according to the second embodiment of the present invention.

FIG. 8 shows a functional arrangement of a decoder 200 associated with the coder 100 shown in FIG. 6, whose parts corresponding to those of the decoder 200 shown in FIG. 5 are denoted by the same reference numerals. An expansion part 21 losslessly expansion-decodes the code sequence Ca on a divisional-unit basis, thereby producing a sequence of digital signal samples Y in the integer format. In this embodiment, an auxiliary decoding part 41 decodes the auxiliary code Cc to produce adjustment information ΔE. Based on the adjustment information ΔE, a digit adjusting part 42 performs reverse digit adjustment, by $E_i+\Delta E$, on the digital signal samples Y in the integer format. If the adjustment information ΔE is positive, the bits of each digital signal sample Y is shifted toward the most significant bit position by ΔE bits. If the adjustment information ΔE is negative, the bits of each digital signal sample Y is shifted toward the least significant bit position by ΔE bits. In this process, as with the reverse digit adjusting part 34 shown in FIG. 6, the bit positions made unoccupied by the shifting are filled with "1"s or "0"s.

The digital signal samples in the integer format from the reverse digit adjusting part 42 are converted into digital signal samples X' in the floating-point format by the floating-point formatting part 22. Each digital signal sample X' and a difference signal ΔX in the floating-point format, which is derived from the difference information Cb through reverse expansion decoding by an expansion part 23, are combined together by the combining part 24. As required, a sample sequence generating part 43 converts the consecutive digital signals into a sample sequence, thereby reproducing the sequence of digital signal samples X in the floating-point format.

Modified Embodiment

Figure 9:
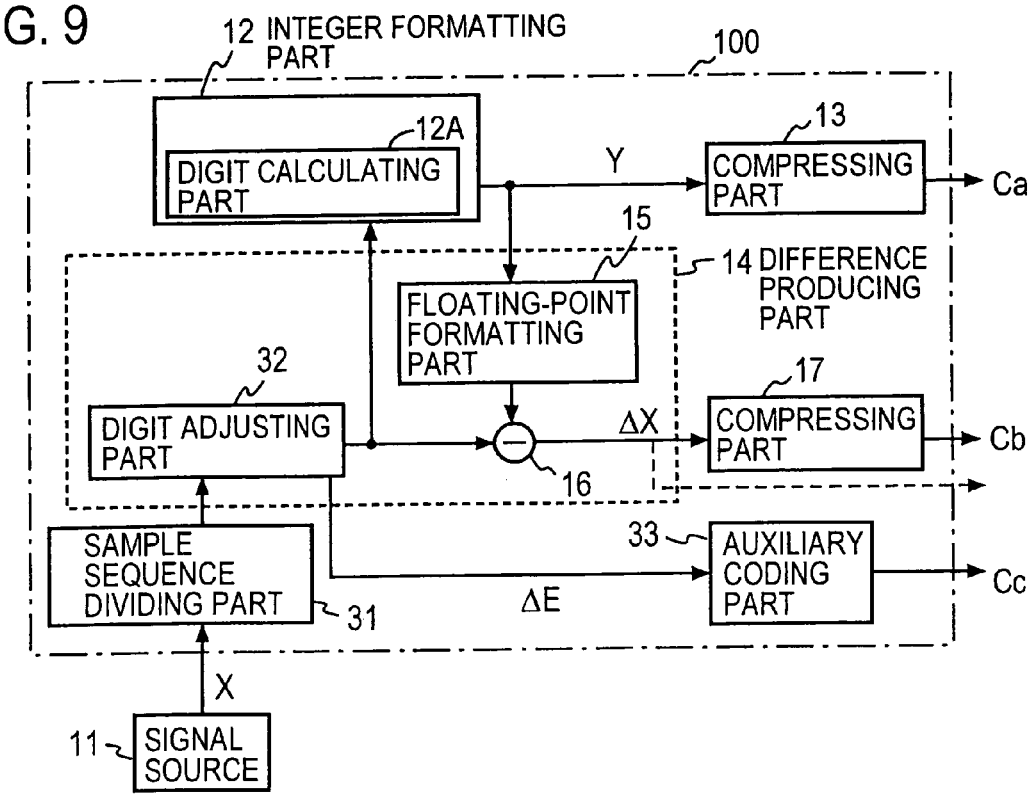
FIG. 9 is a functional diagram of a variation of the coder according to the second embodiment of the present invention.

As shown in FIG. 9, in which the parts corresponding to those in FIG. 6 are denoted by the same reference numerals, without performing the reverse digit adjustment of the digital signal sample Y, the digital signal sample Y in the integer format may be converted into a digital signal sample in the floating-point format by the floating-point formatting part 15, and the difference between the resulting digital signal sample in the floating-point format and the digital signal sample in the floating-point format having been adjusted in digit by the digit adjusting part 32 be determined, thereby producing the difference signal ΔX in the floating-point format. That is, as far as the difference producing part 14 determines, in the floating-point format, the difference signal between the original digital signal sample X in the floating-point format and the digital signal sample Y in the integer format, any of the arrangements shown in FIGS. 2, 6 and 9 can be used.

Figure 10:
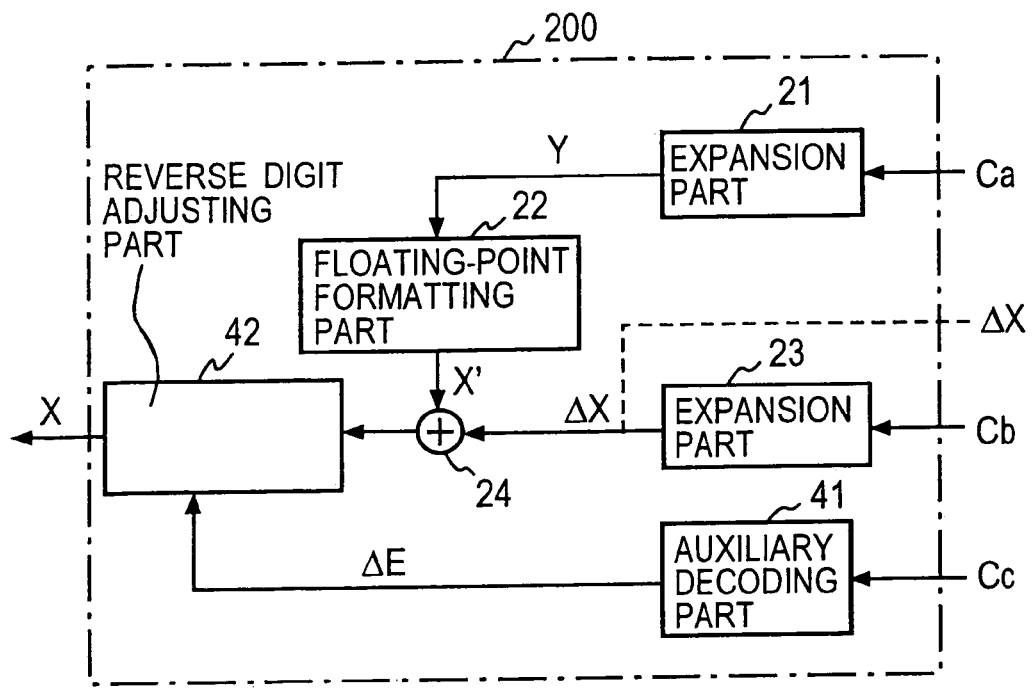
FIG. 10 is a functional diagram of a variation of the decoder according to the second embodiment of the present invention.

Associated with the coder shown in FIG. 9, the decoder 200 shown in FIG. 10 may reproduce the digital signal sample X in the floating-point format by first converting the digital signal sample Y in the integer format, which has been losslessly expansion-decoded by the expansion part 21, into a digital signal sample in the floating-point format by the floating-point formatting part 22, combining together the resulting digital signal sample and the difference signal ΔX in the floating-point format losslessly expansion-decoded by the expansion part 23 by the combining part 24, and then, adjusting the digit of the exponent E of the combination digital signal by the reverse digit adjusting part 42 using the adjustment information ΔE decoded by the auxiliary decoding part 41.

The above description has been made on the assumption that the subtraction part 16 in the coder performs a typical floating-point subtraction, that is, if the exponents E of the relevant two values are different, mantissa subtraction is performed by adjusting the digit of the smaller exponent to that of the larger exponent. In this case, there is a possibility that a lower digit of the mantissa of the value having the smaller exponent E is lost, so that the decoder cannot reproduce accurately the original digital signal sample X in the floating-point format. Thus, a special processing is required. The same applies to the addition performed by the combining part 24 in the decoder.

Figure 11:
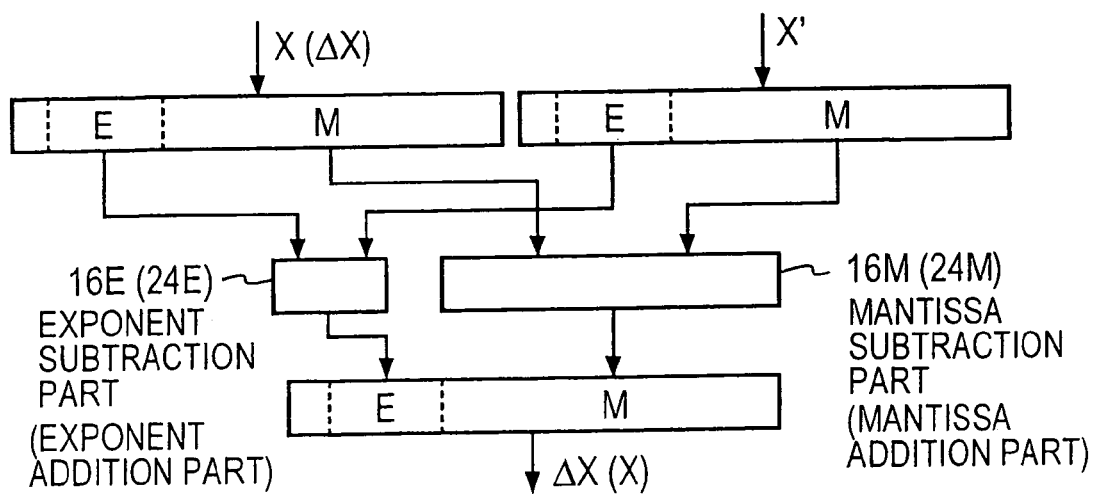
FIG. 11 is a diagram for illustrating subtractions (additions) of values in the floating-point format performed separately for the exponent and the mantissa thereof.

To solve the problem, the exponent E and the mantissa M are separately calculated without performing digit adjustment. As shown in FIG. 11, the difference between the exponent E of the digital signal sample X and the digital signal sample X' is determined by an exponent subtraction part 16E, the difference between the mantissa M of the digital signal sample X and the mantissa M of the digital signal sample X' is determined by a mantissa subtraction part 16M, and the result of the subtraction performed by the exponent subtraction part 16E is used as the exponent E of the difference signal ΔX, and the result of the subtraction performed by the mantissa subtraction part 16M is used as the mantissa M of the difference signal ΔX.

As shown by parentheses in FIG. 11, addition is performed by the combining part 24 in the decoder is the same manner. That is, an exponent addition part 24E sums the exponent E of the difference signal ΔX and the exponent E of the digital signal sample X', a mantissa addition part 24M sums the mantissa M of the difference signal ΔX and the mantissa M of the digital signal sample X', and the result of the addition performed by the exponent addition part 24E is used as the exponent E of the digital signal sample X, and the result of the addition performed by the mantissa addition part 24M is used as the mantissa M of the digital signal sample X.

In this case, even if the absolute value of the floating-point value is greater than the maximum value in the integer format, the floating-point value can be converted into the integer format by limiting the absolute value thereof to the maximum value of the integer. Since the mantissa information and the exponent information are separately retained, all the bits of the floating-point value can be reproduced, so that any exceptional processing is not required.

Therefore, the subtraction part 16 shown in FIGS. 2, 6 and 9 may perform a typical floating-point subtraction, which involves digit adjustment, or perform subtractions separately for the exponent and the mantissa. Similarly, the combining part 24 shown in FIGS. 5, 8 and 10 may perform a typical floating-point addition, which involves digit adjustment, or perform additions separately for the exponent and the mantissa.

Figure 12:
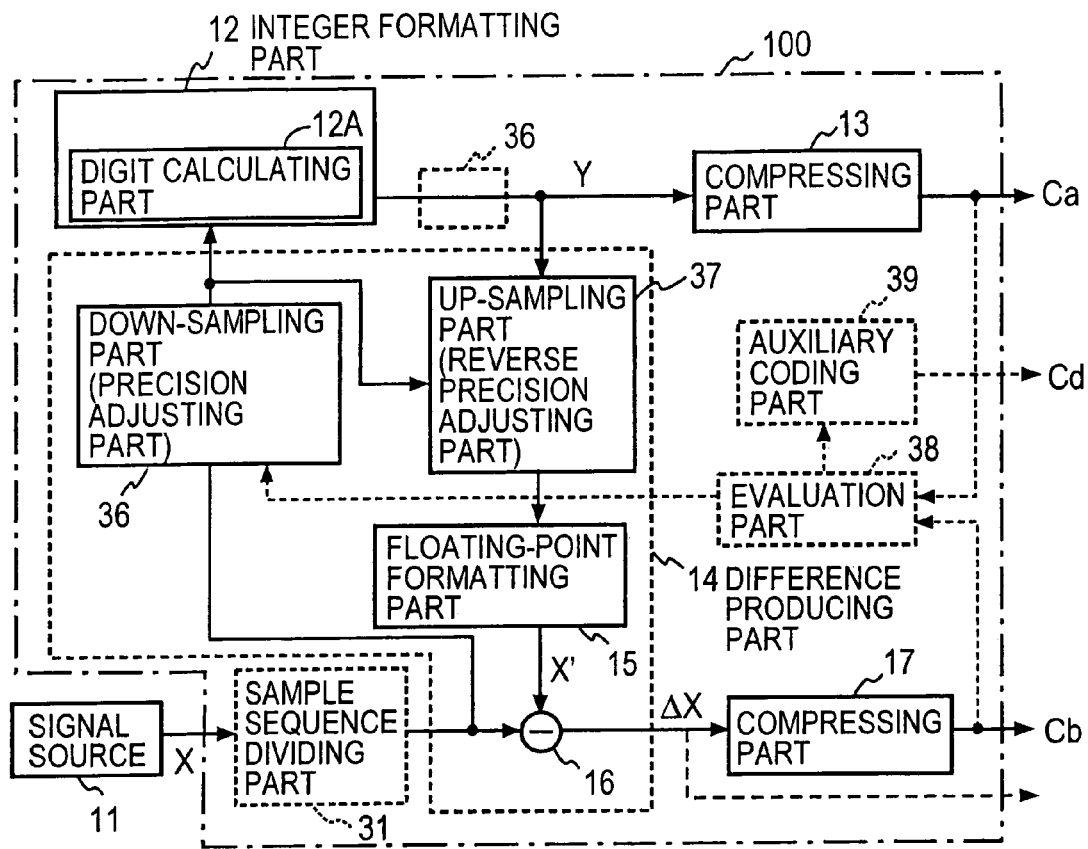
FIG. 12 is a functional diagram of a coder for illustrating a coding method according to another embodiment of the present invention.

As shown in FIG. 12, the sampling frequency of the digital signal ample X in the floating-point format may be down-converted to a lower frequency by a down-sampling part 36, the resulting digital signal sample in the floating-point format at the lower sampling frequency may be converted into a digital signal sample Y in the integer format by the integer formatting part 12, the digital signal sample Y may be supplied to the compressing part 13 and an up-sampling part 37, where up-sampling is performed to convert the digital signal sample Y into a digital signal sample in the integer format at the same sampling frequency as the digital signal sample X in the floating-point format, and the resulting digital signal sample in the integer format may be supplied to the floating-point formatting part 15 and converted into a digital signal sample X' in the floating-point format.

Such down-sampling may be performed on the digital signal sample in the integer format output from the integer formatting part 12, instead of the input to the integer formatting part 12. That is, as shown by a dashed-line block 36 in FIG. 12, the down-sampling part 36 may be inserted at the output side of the integer formatting part 12. In any case, on the decoder side, as shown in FIG. 13, the digital signal sample Y in the integer format decoded by the expansion part 21 is up-sampled by an up-sampling part 45 so that the sampling frequency thereof is converted to the same sampling frequency as the digital signal sample input to the down-sampling part 36 in the coder shown in FIG. 12, and then supplied to the floating-point formatting part 22.

Such a down-sampling part 36 is provided in the case where it can improve the compression efficiency of the entire system. If the fact that the compression ratio is improved is previously known from the digital signal sample Y output from the signal source 11, the down-sampling rate in the down-sampling part 36 can be fixed. However, if only some blocks of digital signal samples X in one sequence require down-sampling, or if it is preferred that the down-sampling rate is changed for each block, as shown by a dashed-line in FIG. 12, a sample sequence dividing part 31 is provided to divide the sequence of digital signal samples X in the floating-point format into blocks of a predetermined number of samples. For each of the divisional blocks, an evaluation part 38 evaluates the case where down-sampling is performed and the case where down-sampling is not performed in terms of compression efficiency of the divisional block, that is, in terms of sum of the number of bits of the code Ca output from the compressing part 13 and the number of bits of the code Cb output from the compressing part 17 to determine which of the two cases provides a smaller sum, determines whether to perform down-sampling in the down-sampling part 36 or whether to increase or decrease the sampling frequency in order to provide a higher compression efficiency, that is, to make the sum of the number of bits of the code Ca and the number of bits of the code Cb, and outputs the codes Ca and Cb that correspond to the better or best case. Besides, an auxiliary coding part 39 outputs, as an auxiliary code Cd, a code that indicates whether the code Ca to be output has been down-sampled or not or auxiliary information that indicates the down-sampling rate.

Figure 13:
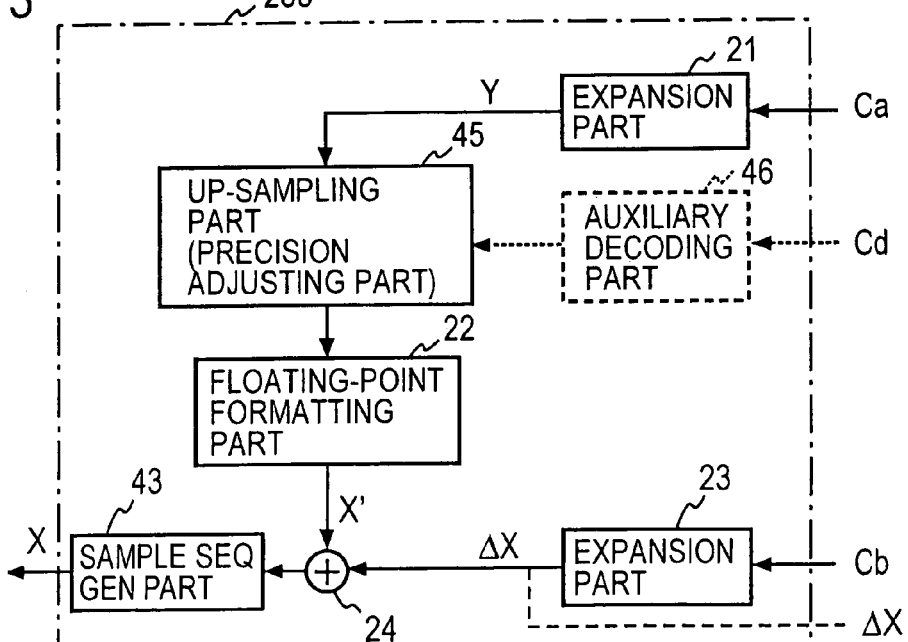
FIG. 13 is a functional diagram of a decoder for illustrating a decoding method according to another embodiment of the present invention.

On the other hand, in the decoder, as shown in FIG. 13, an auxiliary decoding part 46 decodes the auxiliary code Cd. Based on the decoded auxiliary information, up-sampling is performed at a predetermined rate or is not performed by an up-sampling part 45. Alternatively, the up-sampling part 45 performs up-sampling at an up-sampling rate specified by the decoded auxiliary information.

Similarly, in order to raise the entire compression efficiency, when the digital signal sample X in the floating-point format is converted into the digital signal sample Y in the integer format in the coder, the conversion precision may be reduced by intention. For example, the digital signal sample X may be converted into a digital signal sample in the 16-bit integer format. That is, as shown by parentheses in FIG. 12, the quantization precision per sample (the number of bits representing the amplitude thereof) of the digital signal sample X in the floating-point format is reduced by the precision adjusting part 36. More specifically, for example, when the exponent E is 150, the exponent E is reduced to 142 if the sign S is "0" (positive), and the exponent E is increased to 158 if the sign S is "1" (negative). The digital signal sample in the floating-point format having been converted in precision is converted into the digital signal sample Y in the integer format by the integer formatting part 12. The digital signal sample Y is supplied to the compressing part 13 and a reverse precision-adjusting part 37, where the digital signal sample Y is converted into a digital signal sample in the integer format whose quantization precision (number of bits representing the amplitude) is the same as that of the digital signal sample X in the floating-point format, and the digital signal sample in the integer format having been adjusted in precision is supplied to the floating-point formatting part 15 and converted into a digital signal sample X' in the floating-point format.

On the decoder side, the digital signal sample Y in the integer format having been expansion-decoded by the expansion part 21 is adjusted in precision, by the precision adjusting part 45, by a quantity equal to that of precision adjustment performed by the reverse precision-adjusting part 37 in the coder, and then supplied to the floating-point formatting part 22. While the precision adjustment can be performed in a fixed manner, as with the adjustment of sampling frequency, the evaluation 38 may determines whether to perform precision adjustment on a divisional-block basis or to what extent the precision adjustment is performed, in order to improve the compression efficiency. In such a case, the auxiliary code Cd concerning the precision adjustment is output. On the decoder side, if the auxiliary information decoded by the auxiliary decoding part 46 indicates only whether to perform precision adjustment, and if the precision adjustment is to be performed, the precision adjusting part 45 performs precision adjustment, or if the decoded auxiliary information specifies an adjustment quantity, the precision adjusting part 45 adjusts the quantization precision by the specified adjustment quantity.

On the coder side, two or all of the digit adjustment, the adjustment of sampling frequency and the adjustment of quantization precision described above can be used. Accordingly, on the decoder side, two or three of the digit adjustment, the adjustment of sampling frequency and the adjustment of quantization precision are used.

[Implementation by computer]

Figure 14:
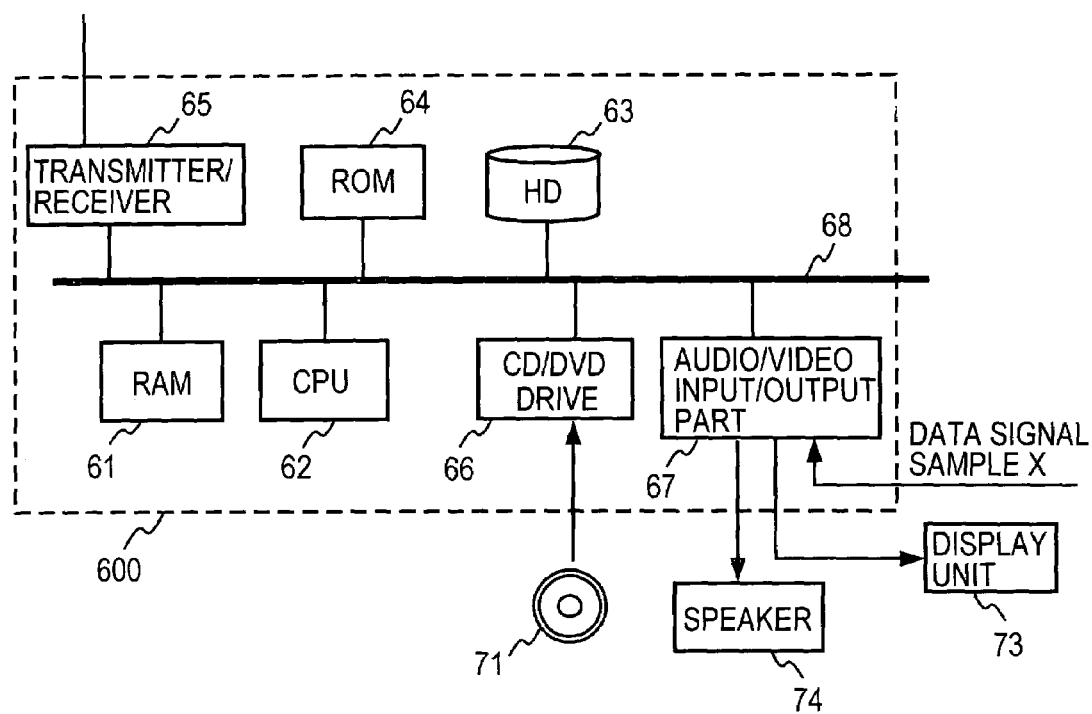
FIG. 14 is a diagram for illustrating a computer on which a coder and a decoder according to the present invention are implemented.

As shown in FIG. 14, the coder 100 shown in FIGS. 2, 6, 9 and 12 can be implemented by a computer 600 comprising a RAM 61, a CPU 62, a hard disk 63, a ROM 64, a transmitter/receiver 65, a CD/DVD drive 66 and an audio/video input/output part 67, which are interconnected via a bus 68.

The ROM 64 stores a program for booting the computer, and the hard disk 63 stores an operating system program for the computer. A program for executing a function of the coder 100 according to the present invention is previously read into the hard disk 63 from a recording medium 71, such as CD-ROM and DVD, via the CD/DVD drive 66, or previously downloaded to the hard disk 63 through a communication line and the transmitter/receiver 65.

The sequence of digital signal samples X in the floating-point format to be coded is externally received at the audio/video input/output part 67, for example, and temporarily stored in the hard disk 63, which serves as a buffer. To start coding, a program for executing coding is read into the RAM 61 from the hard disk 63, and the program is executed by the CPU 62. Th result of coding, such as the codes Ca, Cb (or Z), Cc and Cd, may be transmitted from the transmitter/receiver 65 to the outside via the communication line, or may be stored in a recording medium 65, such as CD and DVD, in the CD/DVD drive 66.

Similarly, in order to implement the decoder 200 shown in FIGS. 5, 8, 10 and 13 by the computer shown in FIG. 14, a program for executing a function of the decoder is stored in the hard disk 63, and a decoding program is executed on the codes Ca, CB (or Z), Cc and Cd received at the transmitter/receiver 65 through the communication line. The result of coding is output to a display unit 73 and a speaker 74 for reproduction.

The present invention can be applied not only to music signals but also to sound signals, image signals and the like.

The invention claimed is:

1. A lossless coding method for a digital signal in a floating-point format, comprising:
   (a) a step of converting a first digital signal sample in the floating-point format into a second digital signal sample in an integer format;
   (b) a step of losslessly compressing a sequence of said second digital signal samples in the integer format to produce a first code sequence;
   (c) a step of producing a difference signal that corresponds to the difference between said second digital signal sample in the integer format and said first digital signal sample in the floating-point format; and
   (d) a step of outputting said first code sequence and difference information corresponding to said difference signal as a coding result.

2. A lossless coding method for a digital signal in a floating-point format according to claim 1, in which said step (d) comprises a step of losslessly compressing said difference signal to produce a second code sequence and a step of outputting said second code sequence as the difference information corresponding to said difference signal.

3. A lossless coding method for a digital signal in a floating-point format according to claim 1 or 2, in which said step (c) comprises a step of converting said second digital signal sample into a third digital signal sample in the floating-point format and a step of producing the difference between said first digital signal sample and said third digital signal sample as said difference signal.

4. A lossless coding method for a digital signal in a floating-point format according to claim 1, in which said step (a) comprises:
   (a-1) a step of detecting, for each of blocks each containing a plurality of first digital signal samples in the floating-point format, the maximum value of the exponents of the first digital signal samples;
   (a-2) a step of adjusting the values of the exponents of the first digital signal samples in the relevant block by an adjustment value determined based on the detected maximum value so that the maximum of the numbers of digits of integer values converted from the first digital signal samples in the relevant block be a predetermined value;
   (a-3) a step of converting the first digital signal samples in the floating-point format in the relevant block whose exponents have been adjusted into the integer format; and
   (a-4) a step of coding adjustment information corresponding to said adjustment value to produce an auxiliary code, and
   said auxiliary code is also output in said step (d).

5. A lossless coding method for a digital signal in a floating-point format according to claim 1 or 4, further comprising:
   a step of down-sampling said first digital signal sample or said second digital signal sample to make the sampling frequency of the digital signal sample used for producing said first code sequence lower than the sampling frequency of said first digital signal sample; and
   a step of up-sampling the digital signal sample used for producing said first code sequence to convert the sampling frequency thereof to the same sampling frequency as said first digital signal sample, thereby producing a digital signal sample used for producing said difference signal.

6. A lossless coding method for a digital signal in a floating-point format according to claim 1 or 4, further comprising:
   a step of converting the quantization precision of each first digital signal sample or each second digital signal sample to make the quantization precision of the digital signal sample used for producing said first code sequence lower than the quantization precision of said first digital signal sample; and
   a step of raising the quantization precision of the digital signal sample used for producing said first code sequence to the quantization precision of said first digital signal sample, thereby producing a digital signal sample used for producing said difference signal.

7. A coding program that makes a computer execute each step of a lossless coding method for a digital signal in a floating-point format according to claim 1.

8. A decoding method for a digital signal in a floating-point format, comprising:
   (a) a step of decoding and expanding a first code sequence to produce a first digital signal sample in an integer format;
   (b) a step of producing a difference signal based on difference information;
   (c) a step of converting said first digital signal sample in the integer format into a second digital signal sample in the floating-point format; and
   (d) a step of combining said second digital signal sample in the floating-point format and said difference signal to produce a third digital signal sample in the floating-point format.

9. A decoding method for a digital signal in a floating-point format according to claim 8,
   in which said step (b) comprises a step of decoding and expanding said difference information to produce said difference signal in the floating-point format.

10. A decoding method for a digital signal in a floating-point format according to claim 8 or 9, further comprising:
    a step of decoding an auxiliary code to produce adjustment information; and
    a step of adjusting the digit of said first digital signal sample in the integer format or said combined signal based on said adjustment information.

11. A decoding method for a digital signal in a floating-point format according to claim 8 or 9, further comprising:
    a step of up-sampling said first digital signal sample in the integer format to make the sampling frequency thereof equal to the sampling frequency of said difference signal, before converting said first digital sample into said second digital signal sample in the floating-point format.

12. A decoding method for a digital signal in a floating-point format according to claim 8 or 9, further comprising:
    a step of converting the quantization precision of each first digital sample in the integer format to the quantization precision of said difference signal, before converting said first digital sample into said second digital signal sample in the floating-point format.

13. A decoding program that makes a computer execute each step of a decoding method for a digital signal in a floating-point format according to claim 8.

14. A lossless coder for a digital signal in a floating-point format, comprising:
    an integer formatting part that converts an input first digital signal sample in a floating-point format into a second digital signal sample in an integer format;

a first compressing part that losslessly compresses a sequence of second digital signal samples in the integer format to produce a first code sequence; and a difference producing part that produces a difference signal corresponding to the difference between said second digital signal sample in the integer format and said first digital signal sample in the floating-point format, in which said first code sequence and difference information corresponding to said difference signal are output as a coding result.

15. A lossless coder for a digital signal in a floating-point format according to claim 14, further comprising:

a second compressing part that losslessly compresses said difference signal to produce a second code sequence and outputs the second code sequence as said difference information corresponding to said difference signal.

16. A lossless coder for a digital signal in a floating-point format according to claim 14, in which said difference producing part comprises a floating-point formatting part that converts said second digital signal sample into a third digital signal sample in the floating-point format and a subtracter that produces the difference between said first digital signal sample in the floating-point format and said third digital signal sample as said difference signal.

17. A lossless coder for a digital signal in a floating-point format according to claim 14, further comprising:

a digit adjusting part that detects, for each of blocks each containing a plurality of first digital signal samples in the floating-point format, the maximum value of the exponents of the first digital signal samples and adjusts the values of the exponents of the first digital signal samples in the relevant block by an adjustment value determined based on the detected maximum value so that the maximum of the numbers of digits of integer values converted from the first digital signal samples in the relevant block be a predetermined value; and an auxiliary coding part that codes adjustment information corresponding to said adjustment value to produce an auxiliary code and outputs the auxiliary code.

18. A lossless coder for a digital signal in a floating-point format according to claim 14, further comprising:

a down-sampling part that down-samples said first digital signal sample or said second digital signal sample to make the sampling frequency of the digital signal sample used for producing said first code sequence lower than the sampling frequency of said first digital signal sample; and an up-sampling part that up-samples the digital signal sample used for producing said first code sequence to convert the sampling frequency thereof to the same sampling frequency as said first digital signal sample, thereby producing a digital signal sample used for producing said difference signal in the floating-point format.

19. A lossless coder for a digital signal in a floating-point format according to claim 14, further comprising:

a precision adjusting part that converts the quantization precision of each first digital signal sample or each second digital signal sample to make the quantization precision of the digital signal sample used for producing said first code sequence lower than the quantization precision of said first digital signal sample; and a reverse precision adjusting part that raises the quantization precision of the digital signal sample used for producing said first code sequence to the quantization precision of said first digital signal sample, thereby producing a digital signal sample used for producing said difference signal.

20. A decoder for a digital signal in a floating-point format, comprising:

a first expansion part that receives a first code sequence and decodes and expands the first code sequence to produce a first digital signal sample in an integer format;

a floating point formatting part that receives said first digital signal sample in the integer format and converts the first digital signal sample into a second digital signal sample in the floating-point format;

a combining part that receives a difference signal based on difference information and combines said difference signal and said first digital signal sample in the floating-point format to produce a third digital signal sample in the floating-point format.

21. A decoder for a digital signal in a floating-point format according to claim 20, further comprising:

a second expansion part that decodes and expands said difference information to produce said difference signal.

22. A decoder for a digital signal in a floating-point format according to claim 20 or 21, further comprising:

an auxiliary coding part that decodes an auxiliary code to produce adjustment information; and a digit adjusting part that adjusts the digit of said first digital signal sample in the integer format or said combined signal based on said adjustment information.

23. A decoder for a digital signal in a floating-point format according to claim 20 or 21, further comprising:

an up-sampling part that up-samples said first digital sample in the integer format to make the sampling frequency thereof equal to the sampling frequency of said difference signal, before converting said first digital sample into said second digital signal sample in the floating-point format.

24. A decoder for a digital signal in a floating-point format according to claim 20 or 21, further comprising:

a precision adjusting part that converts the quantization precision of each first digital signal sample in the integer format to the quantization precision of said difference signal, before converting said first digital signal sample into said second digital signal sample in the floating-point format.

* * * * *